(12) United States Patent
Nagai

(10) Patent No.: US 7,209,853 B2
(45) Date of Patent: Apr. 24, 2007

(54) MEASURING APPARATUS AND PROGRAM

(75) Inventor: Hiroyuki Nagai, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 11/256,048

(22) Filed: Oct. 21, 2005

(65) Prior Publication Data

US 2006/0036411 A1  Feb. 16, 2006

Related U.S. Application Data

(63) Continuation of application No. PCT/JP2004/005982, filed on Apr. 26, 2004.

(30) Foreign Application Priority Data

Apr. 25, 2003 (JP) .............................. 2003-122130

(51) Int. Cl.
*G01R 13/00* (2006.01)
(52) U.S. Cl. .......................... 702/125; 702/71
(58) Field of Classification Search ................. 702/125
See application file for complete search history.

(56) References Cited

U.S. PATENT DOCUMENTS 6,263,290 B1 * 7/2001 Williams et al. ............... 702/71

FOREIGN PATENT DOCUMENTS

| JP | 58-111525 | 7/1983 |
|----|-----------|--------|
| JP | 2004-45085 | 2/2004 |

OTHER PUBLICATIONS

International Search Report for International Application No. PCT/JP2004/005982 mailed on Aug. 17, 2004, 1 page.

* cited by examiner

*Primary Examiner*—John Barlow
*Assistant Examiner*—Jonathan Moffat
(74) *Attorney, Agent, or Firm*—Osha Liang LLP

(57) ABSTRACT

There is provided a measuring apparatus that measures digital signals. The measuring apparatus includes a reference timing detecting unit operable to detect a first timing at which a digital signal becomes a first predetermined signal level and a second timing at which the digital signal becomes a second signal level different from the first signal level in an edge of the digital signal, and a timing computing unit operable to compute a third timing at which the digital signal becomes a third predetermined signal level based on the first signal level, the second signal level, the first timing, and the second timing.

2 Claims, 14 Drawing Sheets

| OUTPUT OF 42 | 000111·········111 |
|---|---|
| OUTPUT OF 46 | 001000·········000 |

HCOMP DATA   00011

| OUTPUT OF 44 | 000001·········111 |
|---|---|
| OUTPUT OF 48 | 000010·········000 |

LCOMP DATA   00101

OUTPUT DATA

| 7 | 6 | 5 | 4 | 3 | 2 | 1 | 0 |
|---|---|---|---|---|---|---|---|
| ERROR BIT | GLITCH | INITIAL VALUE | VARIATION POINT POSITION DATA (THIRD TIMING) | | | | |

*FIG. 8*

MEASURING APPARATUS AND PROGRAM

The present application is a continuation application of PCT/JP2004/005982 filed on Apr. 26, 2004, which claims priority from a Japanese Patent Application No. 2003-122130 filed on Apr. 25, 2003, the contents of which are incorporated herein by reference.

BACKGROUND OF THE INVENTION

1. Field of the Invention

The present invention relates to a measuring apparatus for measuring a digital signal. More particularly, the present invention relates to a measuring apparatus and a program for measuring timing such as a variation point of a digital signal value and an intersection point of differential digital signals.

2. Description of Related Art

Conventionally, when testing an electronic device, the good or bad of the electronic device is decided by measuring output signals from the electronic device. For example, the good or bad of the electronic device is decided by comparing output signals from the electronic device and predetermined patterns with each other.

Conventionally, such a decision is performed by generating strobe signals in a predetermined period and detecting a value of an output signal in the timing of the strobe signal. For example, the decision is performed by comparing the value of the detected output signal and given H comparison level and L comparison level, converting the output signal into H logic and L logic patterns, and comparing the patterns and expectation patterns.

Moreover, the good or bad of the electronic device can also be decided by evaluating a waveform of an output signal from the electronic device. For example, the good or bad of the electronic device can be decided by whether the timing at an edge of the output signal is within a predetermined range.

The timing at the edge of the output signal can be measured by detecting a signal value near the edge of the output signal, e.g., by means of a multi-strobe (a polyphase strobe) including a plurality of strobes of which phases are slightly different from one another. In other words, the timing at the edge of the output signal is measured by converting the output signal near the edge into H logic and L logic patterns and detecting a phase of a strobe that varies from H logic to L logic, by means of the multi-strobe.

Moreover, a characteristic of the electronic device to be test includes the timing at a variation point of an output signal, the timing at a cross point of differential output signals, and so on, e.g., given from a HIZ (high impedance) level.

The HIZ level and the level of the cross point of the differential output signal are generally smaller than H comparison level and larger than L comparison level. For this reason, it is difficult to detect the timing at the variation point or the timing at the cross point of the differential output signals given from the HIZ level by means of a conventional method. For example, the conventional method can detect the variation point or the cross point of the differential output signal given from the HIZ level by shifting H comparison level or L comparison level by degrees. However, it is difficult to do such a control.

SUMMARY OF THE INVENTION

Therefore, it is an object of the present invention to provide a measuring apparatus and a program that can solve the foregoing problems. The above and other objects can be achieved by combinations described in the independent claims. The dependent claims define further advantageous and exemplary combinations of the present invention.

To solve this problem, according to the first aspect of the present invention, there is provided a measuring apparatus that measures differential digital signals. The measuring apparatus includes: a first reference timing detecting unit operable to detect a first timing at which a first digital signal becomes a first predetermined signal level and a second timing at which the first digital signal becomes a second signal level different from the first signal level, in an edge of the first digital signal among the differential digital signals; a second reference timing detecting unit operable to detect a fourth timing at which a second digital signal becomes a fourth predetermined signal level and a fifth timing at which the second digital signal becomes a fifth signal level different from the fourth signal level, in an edge of the second digital signal among the differential digital signals; and a timing computing unit operable to compute a timing at an intersection of the edge of the first digital signal and the edge of the second digital signal based on the first signal level, the second signal level, the fourth signal level, the fifth signal level, the first timing, the second timing, the fourth timing, and the fifth timing.

The timing computing unit may include: a first slope computing unit that computes a slope of the edge of the first digital signal based on the first timing and the second timing detected by the first reference timing detecting unit; and a second slope computing unit that computes a slope of the edge of the second digital signal based on the fourth timing and the fifth timing detected by the second reference timing detecting unit, and the timing at the intersection may be computed based on the slope of the edge of the first digital signal and the slope of the edge of the second digital signal.

The timing computing unit may include: a timing storing unit that stores a provisional timing at the intersection with respect to a combination of the slope of the edge of the first digital signal and the slope of the edge of the second digital signal and outputs the provisional timing according to the slope of the edge of the first digital signal and the slope of the edge of the second digital signal to be supplied; a phase shift correction coefficient storing unit that stores a unit correction coefficient, to correct the provisional timing, per a unit phase difference between a phase of the first digital signal and a phase of the second digital signal with respect to the combination of the slope of the edge of the first digital signal and the slope of the edge of the second digital signal and outputs the unit correction coefficient according to the slope of the edge of the first digital signal and the slope of the edge of the second digital signal to be supplied; and a multiplication unit that computes a phase difference between the phase of the first digital signal and the phase of the second digital signal and computes a correction coefficient made by multiplying the phase difference by the unit correction coefficient output from the phase shift correction coefficient storing unit, and the timing at the intersection may be computed based on the provisional timing output from the timing storing unit and the correction coefficient output from the phase difference computing unit.

According to the second aspect of the present invention, there is provided a program making a measuring apparatus measure differential digital signals. The program causes the measuring apparatus to act as: a first reference timing detecting unit operable to detect a first timing at which a first digital signal becomes a first predetermined signal level and a second timing at which the first digital signal becomes a second signal level different from the first signal level, in an edge of the first digital signal among the differential digital signals; a second reference timing detecting unit operable to detect a fourth timing at which a second digital signal becomes a fourth predetermined signal level and a fifth timing at which the second digital signal becomes a fifth signal level different from the fourth signal level, in an edge of the second digital signal among the differential digital signals; and a timing computing unit operable to compute a timing at an intersection of the edge of the first digital signal and the edge of the second digital signal based on the first signal level, the second signal level, the fourth signal level, the fifth signal level, the first timing, the second timing, the fourth timing, and the fifth timing.

The summary of the invention does not necessarily describe all necessary features of the present invention. The present invention may also be a sub-combination of the features described above.

BRIEF DESCRIPTION OF THE DRAWINGS

FIG. 4A is a view exemplary showing an operation of a signal level detecting unit, an exclusive logic circuit, and an encoder, and FIG. 4B is a view exemplary showing an operation of a signal level detecting unit, an exclusive logic circuit, and an encoder.

FIG. 6A shows an example in which the digital signal varies from a HIZ level to a trailing edge, FIG. 6B shows an example in which the digital signal varies from the HIZ level to a rising edge, FIG. 6C shows an example in which the digital signal varies from the trailing edge to the HIZ level, and FIG. 6D shows an example in which the digital signal varies from the rising edge to the HIZ level.

FIG. 8 is a view exemplary showing an output data generated from an output data generating unit.

DETAILED DESCRIPTION OF THE INVENTION

The invention will now be described with reference to embodiments, which do not intend to limit the scope of the present invention, but exemplify the invention. All of the features and the combinations thereof described in the embodiment are not necessarily essential to the invention.

Figure 1:
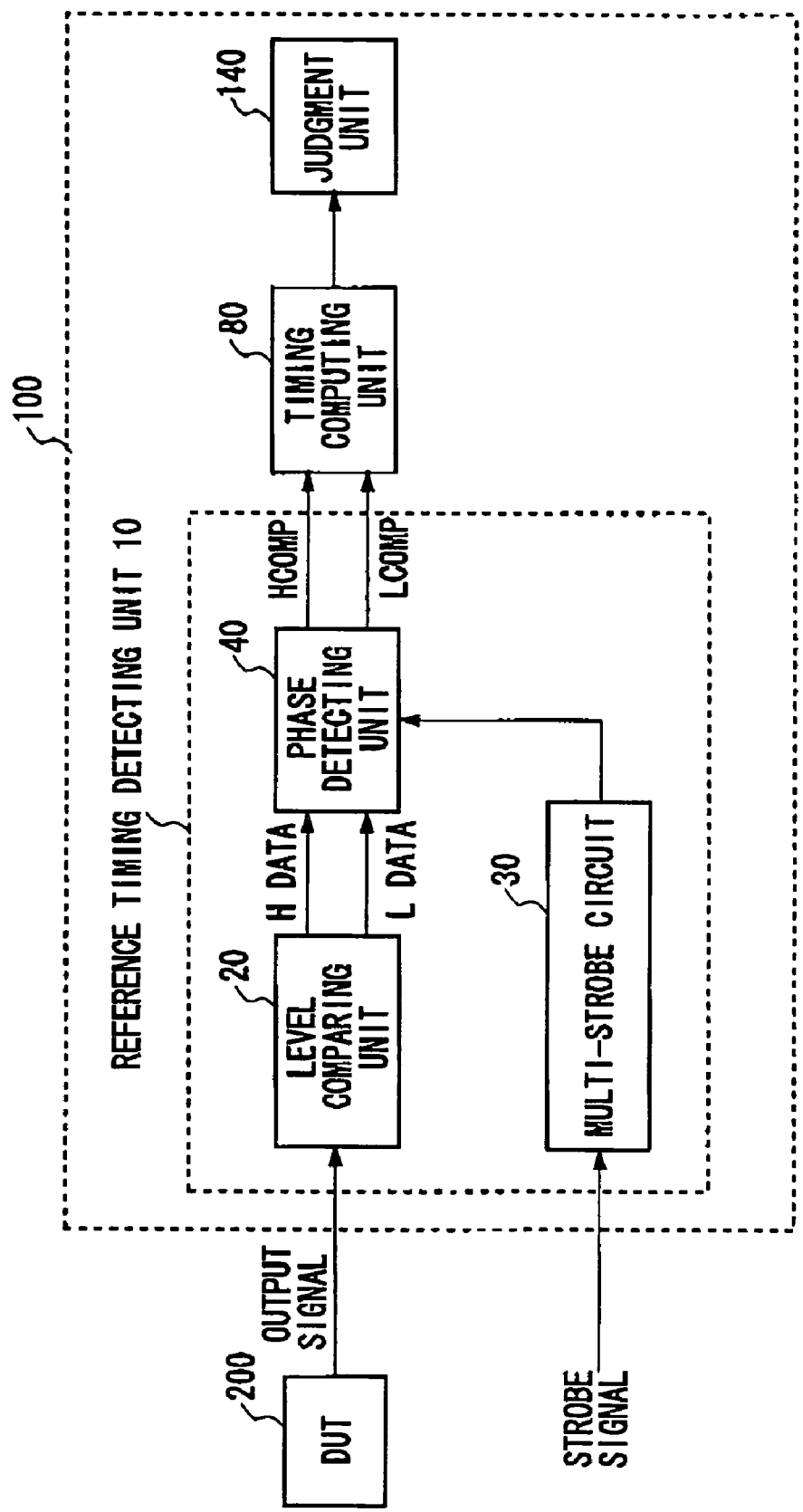
FIG. 1 is a view exemplary showing a configuration of a measuring apparatus according to an embodiment of the present invention.

FIG. 1 is a view exemplary showing a configuration of a measuring apparatus 100 according to an embodiment of the present invention. The measuring apparatus 100 measures output signals output from an electronic device 200 in order to decide the good or bad of the electronic device 200. The measuring apparatus 100 includes a reference timing detecting unit 10, a timing computing unit 80, and a judgment unit 140.

The reference timing detecting unit 20 includes a level comparing unit 20, a multi-strobe circuit 30, and a phase detecting unit 40. The level comparing unit 20 compares the digital signals output from the electronic device 200 with a first signal level and a second signal level given previously. For example, the level comparing unit 20 is supplied with the first signal level (VOH) and the second signal level (VOL) smaller than the first signal level, and outputs a comparison result between the first signal level and the digital signal as H data and a comparison result between the second signal level and the digital signal as L data.

The multi-strobe circuit 30 generates a multi-strobe having a plurality of strobes that has a phase different from one another by inches. The multi-strobe circuit 30 generates a multi-strobe at the timing generally same as that of an edge of a digital signal. Moreover, the multi-strobe circuit 30 may generate a multi-strobe in a predetermined period corresponding to an edge of a digital signal.

The phase detecting unit 40 detects the timing at the variation point at which a data value varies in relation to the H data and L data output from the level comparing unit 20. In this example, the phase detecting unit 40 detects the values of the H data and L data in the timing of each strobe being included in the multi-strobe generated from the multi-strobe circuit 30. Then, the phase detecting unit 40 computes the position of the variation point of the values of the H data and L data based on the timing of the strobe at which the change of the values of the H data and L data is detected. Moreover, the phase detecting unit 40 outputs HCOMP and LCOMP indicative of the timing at the variation point of the values of the H data and L data.

By such an operation, the reference timing detecting unit 10 detects the first timing (HCOMP) at which the digital signal becomes the predetermined first signal level and the second timing (LCOMP) at which the digital signal becomes the second signal level different from the first signal level, at the edge of the digital signal output from the electronic device 200.

The timing computing unit 80 computes a third timing at which the digital signal becomes a predetermined third signal level based on the first signal level and the second signal level supplied to the reference timing detecting unit 10 and the first timing and the second timing detected from the phase detecting unit 40. In other words, the timing computing unit 80 computes the third timing when the digital signal is changed from the third signal level to another signal level via the first signal level and the second signal level. For example, the timing computing unit 80 is supplied with a high impedance level of the digital signal as the third signal level, and computes the timing at the variation point at which a level of the digital signal varies from the high impedance level as the third timing. A method of computing the third timing in the timing computing unit 80 will be explained in detail with reference to FIG. 5.

The judgment unit 140 decides the good or bad of the electronic device 200 based on whether the third timing computed from the timing computing unit 80 is within a predetermined range.

Figure 2:
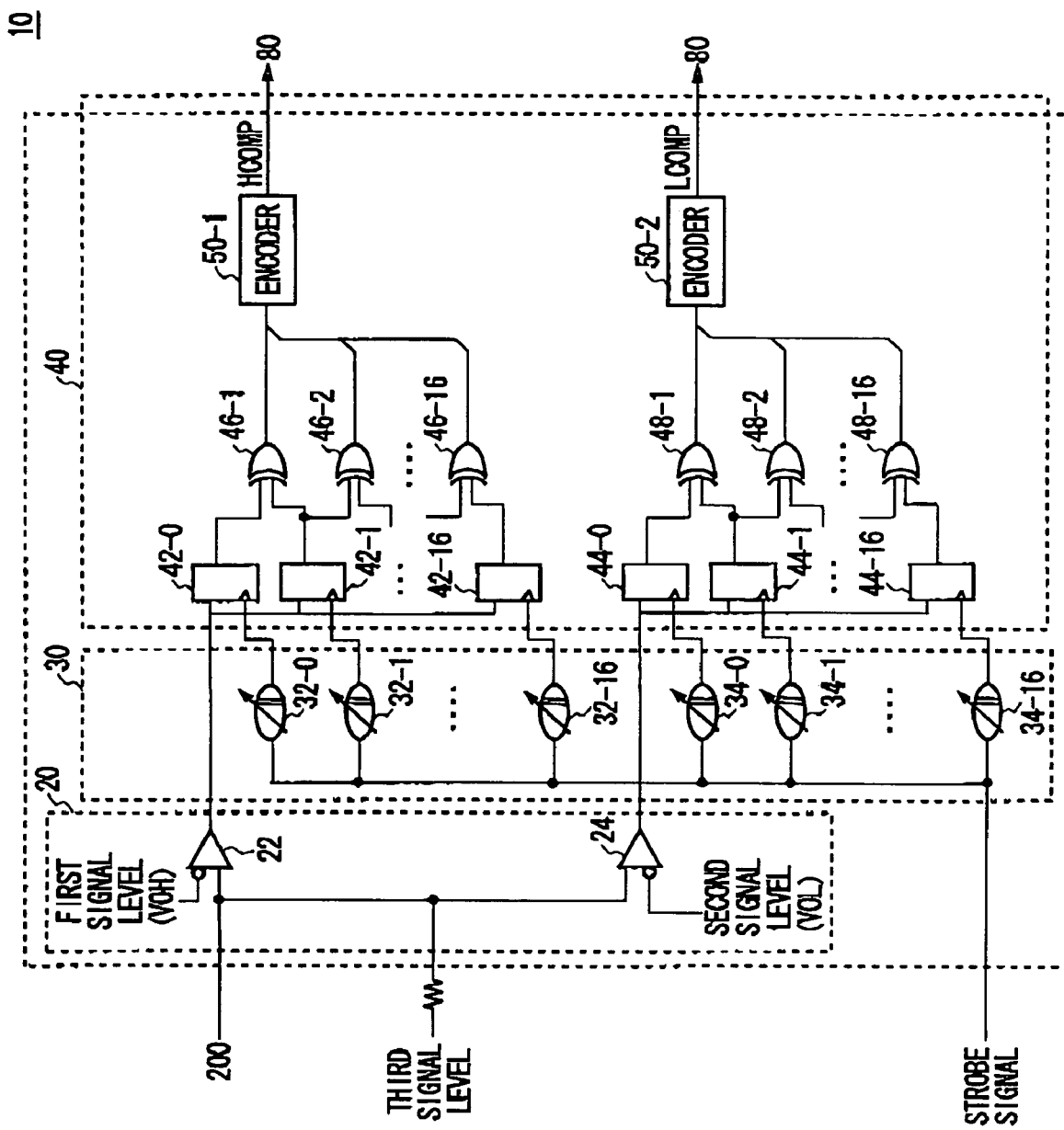
FIG. 2 is a view exemplary showing a configuration of a level comparing unit, a multi-strobe circuit, and a phase detecting unit.

FIG. 2 is a view exemplary showing a configuration of the level comparing unit 20, the multi-strobe circuit 30, and the phase detecting unit 40. The level comparing unit 20 has a comparator 22 and a comparator 24. The comparator 22 is supplied with the first signal level and the digital signal output from the electronic device 200, and outputs H data according to the comparison result between the first signal level and the digital signal. In this example, the comparator 22 outputs the H data that shows an L logic (a pass) when the value of the digital signal is more than the first signal level and an H logic (a fail) when the value of the digital signal is smaller than the first signal level.

Moreover, the comparator 24 is supplied with the second signal level and the digital signal, and outputs L data according to the comparison result between the second signal level and the digital signal. In this example, the comparator 24 outputs the L data that shows an L logic when the value of the digital signal is less than the second signal level and an H logic when the value of the digital signal is larger than the second signal level.

The multi-strobe circuit 30 has a plurality of variable delay circuits (32-0 to 32-16, hereinafter referred to as 32) and a plurality of variable delay circuits (34-0 to 34-16, hereinafter referred to as 34). However, the number of the variable delay circuits 32 and the variable delay circuits 34 is not limited to 17 as shown in the present drawing.

The plurality of variable delay circuits 32 is set so that a delay amount of each circuit is different from one another by inches, and delays strobe signals supplied from the outside in delay amounts different from one another in order to output a multi-strobe including a plurality of strobes having a phase different from one another by inches. Similarly, the plurality of variable delay circuits 34 also outputs a multi-strobe including a plurality of strobes having a phase different from one another by inches. It is preferable that the plurality of variable delay circuits 32 and the plurality of variable delay circuits 34 output the multi-strobes in which the phase of each strobe is generally same at the generally same timing.

The phase detecting unit 40 has a plurality of signal level detecting units (42-0 to 42-16, hereinafter referred to as 42), a plurality of signal level detecting units (44-0 to 44-16, hereinafter referred to as 44), a plurality of exclusive logic circuits (46-1 to 46-16, hereinafter referred to as 46), a plurality of exclusive logic circuits (48-1 to 48-16, hereinafter referred to as 48), an encoder 50-1, and an encoder 50-2.

The plurality of signal level detecting units 42 is provided corresponding to the plurality of variable delay circuits 32, and outputs the value of H data at the timing of the strobe output from the corresponding variable delay circuits 32. Moreover, the plurality of signal level detecting units 44 is provided corresponding to the plurality of variable delay circuits 34, and outputs the value of L data at the timing of the strobe output from the corresponding variable delay circuits 34.

Each of the exclusive logic circuits 46 outputs an exclusive logical sum of the outputs from two signal level detecting units 42 in which the phases (a phase number) of the supplied strobes are adjacent. In other words, when the value of H data output from the corresponding two signal level detecting units 42 has been changed, each of the exclusive logic circuits 46 outputs the H logic. Similarly, each of the exclusive logic circuits 48 also outputs an exclusive logical sum of the outputs from two signal level detecting units 44 in which the phases of the supplied strobes are adjacent.

By such an operation, the plurality of exclusive logic circuits 46 and the plurality of exclusive logic circuits 48 respectively output a signal showing that the values of H data and L data have been changed at the timing of any strobe. In this example, only a bit corresponding to a phase number of the strobe in which the change of value has been detected outputs a 16-bit signal indicative of the H logic.

The encoder 50-1 encodes the signals output from the plurality of exclusive logic circuits 46, and outputs HCOMP obtained by representing a phase number of the strobe in a binary number, in which the change of value of H data has been detected. Moreover, the encoder 50-2 encodes the signals output from the plurality of exclusive logic circuits 46, and outputs LCOMP obtained by representing a phase number of the strobe in a binary number, in which the change of value of L data has been detected.

By an operation as described above, the reference timing detecting unit 10 can detect the first timing (HCOMP) and the second timing (LCOMP) at which the digital signals become the predetermined first signal level and second signal level.

Figure 3:
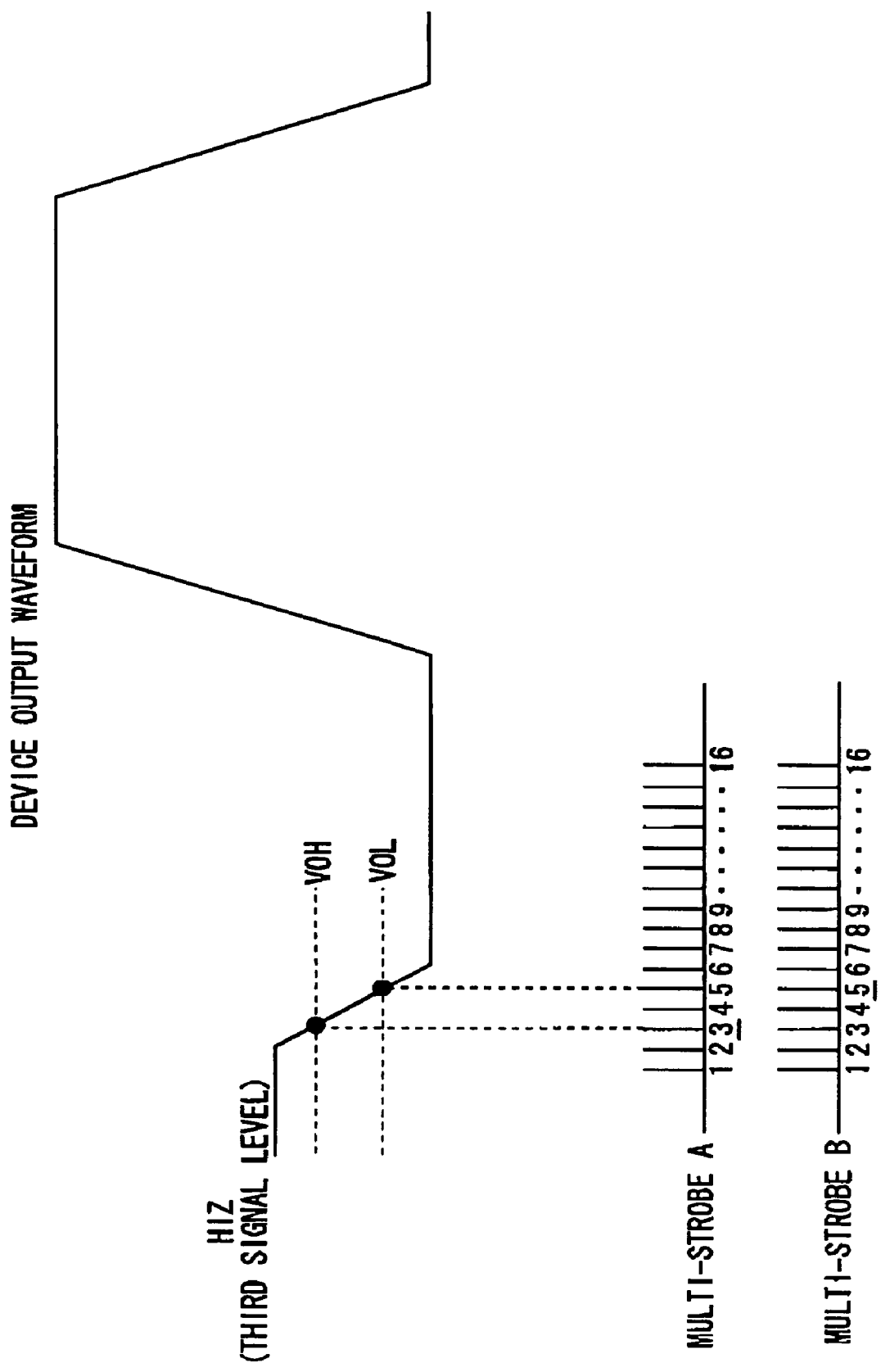
FIG. 3 is a view exemplary showing a waveform of an output signal output from an electronic device.

FIG. 3 is a view exemplary showing an output waveform of the digital signal output from the electronic device 200. Generally, a voltage of an output pin of the electronic device 200 is a high impedance (HIZ) level. When the electronic device 200 outputs a digital signal, the voltage of the output pin of the electronic device 200 varies with the HIZ level. The measuring apparatus 100 in this example computes the timing at the variation point from the HIZ level of the digital signal output from the electronic device 200.

Moreover, it is preferable that the measuring apparatus 100 further includes a means for controlling the first signal level and the second signal level supplied to the level comparing unit 20 according to measurement contents. For example, when usually measuring a pattern of the digital signal, the control means supplies the first signal level (VOH) higher than the HIZ level and the second signal level (VOL) lower than the HIZ level to the level comparing unit 20. Then, the level comparing unit 20 converts the digital signal into a pattern of the H logic or L logic.

Moreover, like this example, when detecting the variation point from the HIZ level of the digital signal, the control means supplies the first signal level (VOH) having a value between the HIZ level (the third signal level) and the second signal level (VOL) to the level comparing unit 20.

Then, as described above, the multi-strobe circuit 30 generates the generally same multi-strobe A and multi-strobe B in association with a change edge from the HIZ level. The phase detecting unit 40 detects the timing, at which the digital signal becomes a level of VOH or VOL, using these multi-strobes in the edge of the digital signal. In this example, the timing at which the digital signal becomes the level of VOH is detected by a phase number 3 strobe of the multi-strobe A, and the timing at which the digital signal becomes the level of VOL is detected by a phase number 5 strobe of the multi-strobe B.

Figure 4A:
FIGS. 4A and 4B are views exemplary showing an operation of the phase detecting unit.
Figure 4B:

FIGS. 4A and 4B are views exemplary showing an operation of the phase detecting unit 40. FIG. 4A is a view exemplary showing an operation of the signal level detecting unit 42, the exclusive logic circuit 46, and the encoder 50-1.

Each of the level detecting units 42 detects a value of H data at the timing of each strobe of the multi-strobe A explained in FIG. 3.

Then, each of the exclusive logic circuits 46 computes an exclusive logical sum of the adjacent data, in order to output the data indicative of a phase number of the strobe in which the timing at which the digital signal becomes the VOH level has been detected. Moreover, the encoder 50-1 encodes the data output from the exclusive logic circuit 46, in order to output HCOMP obtained by representing a phase number of the strobe in a binary number, in which the timing at which the digital signal becomes the VOH level has been detected. Since the encoder 50-1 outputs a phase number of a strobe in a binary number, an operation in the timing computing unit 80 becomes easy.

FIG. 4B is a view exemplary showing an operation of the signal level detecting unit 44, the exclusive logic circuit 48, and the encoder 50-2. Similarly to FIG. 4A, the encoder 50-2 shown in FIG. 4B also outputs LCOMP obtained by representing a phase number of the strobe in a binary number, in which the timing at which the digital signal becomes the VOL level has been detected.

Figure 5:
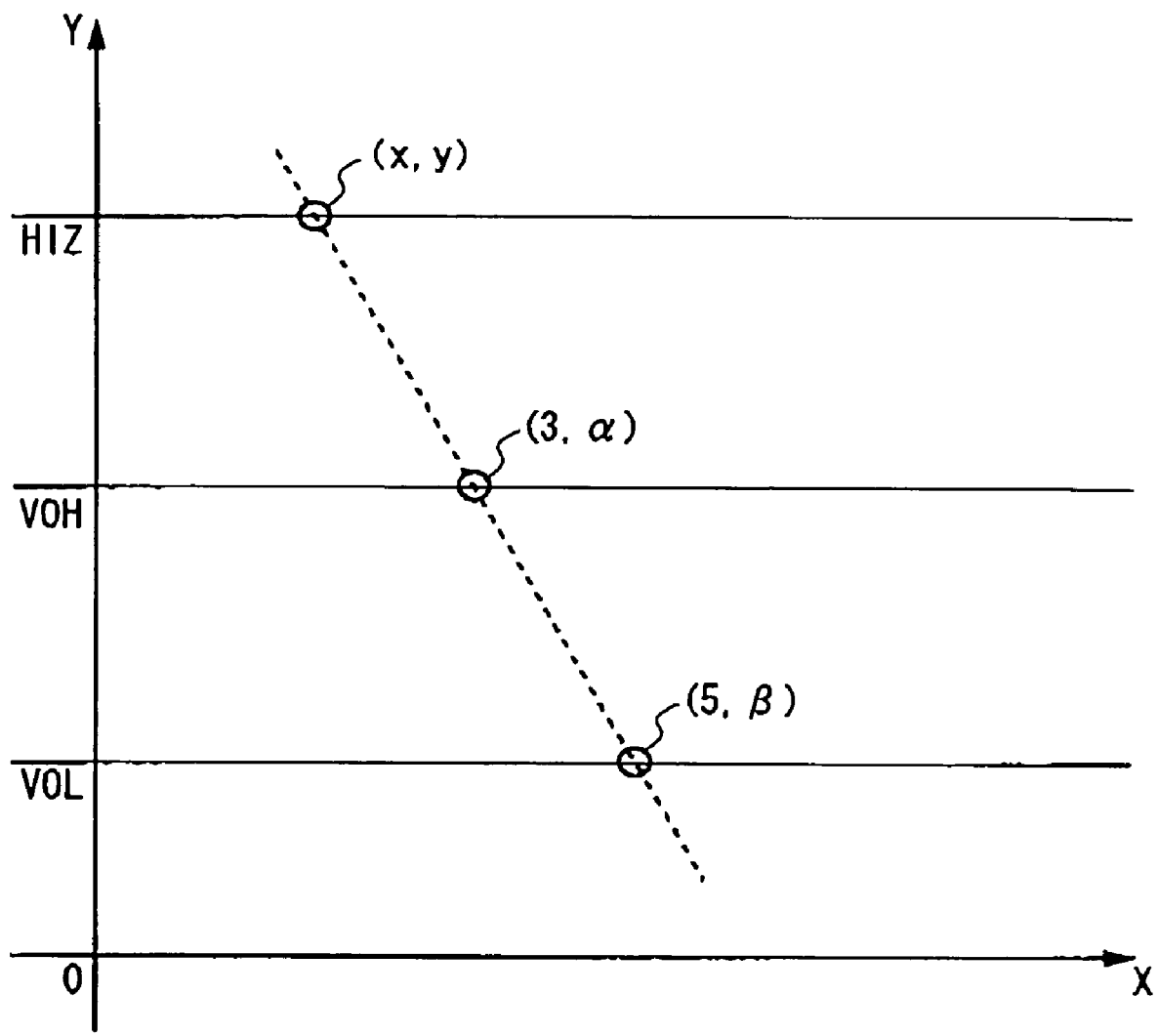
FIG. 5 is a view exemplary explaining an operation of a timing computing unit.

FIG. 5 is a view exemplary explaining an operation of the timing computing unit 80. The timing computing unit 80 computes the timing at which the digital signal becomes the third signal level (HIZ in this example) based on the first timing (HCOMP) detected from the phase detecting unit 40, the second timing (LCOMP), the first signal level (VOH), and the second signal level (VOL).

As shown in FIG. 5, when defining a horizontal axis as timing, a vertical axis as a signal level, the first signal level as α, and the second signal level as β, the coordinate of point A at which the digital signal in an example of FIG. 4 becomes the VOH level is (3, α) and the coordinate of point B at which the digital signal becomes the VOL level is (5, β). In other words, an edge of the digital signal is shown by a straight line linking these two points. Moreover, a point at which the digital signal is changed from the HIZ level is a point at which a y coordinate of a straight line linking the point A and the point B becomes the HIZ level.

The timing computing unit 80 computes an equation of the straight line linking the point A and the point B, and computes a value of an x coordinate at which a y coordinate of the equation becomes the HIZ level, ie., the timing. The output of the electronic device 200 is usually terminated at a VTT level in the measuring apparatus 100. Therefore, the HIZ level is equal to the VTT level in the measuring apparatus 100, and is a known value. Moreover, it is possible to easily compute the timing at which the digital signal becomes a predetermined signal level by substituting a value of a desired signal level for the y coordinate of the equation.

Moreover, it is possible to further easily compute the timing at the variation point from the HIZ level by setting the first signal level (VOH) supplied to the level comparing unit 20 in a half-way point between the second signal level (VOL) and the HIZ level. In other words, since HIZ-VOH:VOH-VOL=1:1, the timing (the third timing) of the variation point from the HIZ level can easily be computed from HCOMP-(LCOMP-HCOMP). In other words, the third timing can be computed by subtracting the difference between the second timing and the first timing from the first timing.

Moreover, in this example, it has been described about when the digital signal varies with a trailing edge from the HIZ level. However, although the digital signal varies with a rising edge from the HIZ level, it is possible to easily compute the timing at the variation point from the HIZ level.

FIGS. 6A to 6D are views exemplary showing a waveform of the digital signal. Moreover, FIGS. 6A to 6D will describe about when the first signal level (VOH) in the middle of the HIZ level and the second signal level (VOL) is given.

Figure 6A:
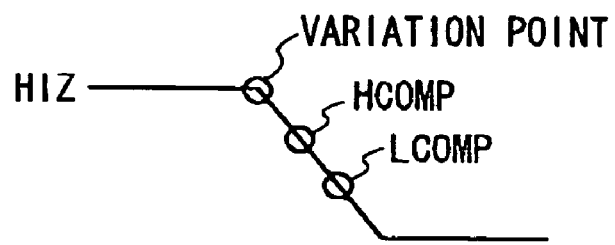
FIGS. 6A to 6D are views exemplary showing a waveform of a digital signal.

FIG. 6A shows an example in which the digital signal varies from the HIZ level to a trailing edge. In this case, the timing computing unit 80 computes the timing at the variation point from the HIZ level by operating HCOMP-(LCOMP-HCOMP) as described above. In other words, the timing computing unit 80 computes the third timing by subtracting the difference between the second timing and the first timing from the first timing.

Figure 6B:
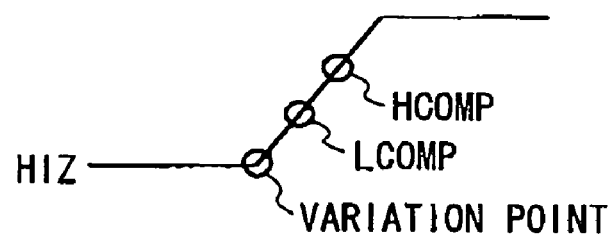

FIG. 6B shows an example in which the digital signal varies from the HIZ level to a rising edge. In this case, the timing computing unit 80 computes the timing at the variation point from the HIZ level by operating LCOMP-(HCOMP-LCOMP). In other words, the timing computing unit 80 computes the third timing by subtracting the difference between the first timing and the second timing from the second timing.

Figure 6C:
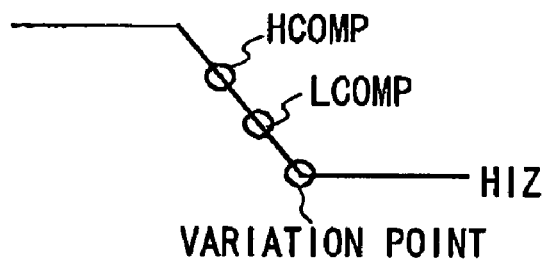

FIG. 6C shows an example in which the digital signal varies from the trailing edge to the HIZ level. In this case, the timing computing unit 80 computes the timing at the variation point to the HIZ level by operating LCOMP+(LCOMP-HCOMP). In other words, the timing computing unit 80 computes the third timing by adding the difference between the second timing and the first timing to the second timing.

Figure 6D:
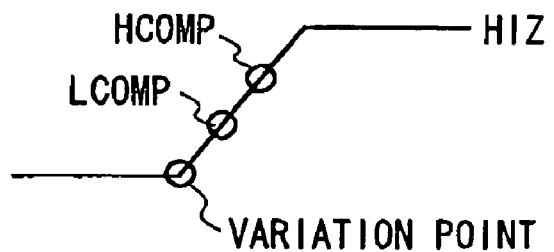

FIG. 6D shows an example in which the digital signal varies from the rising edge to the HIZ level. In this case, the timing computing unit 80 computes the timing at the variation point to the HIZ level by operating HCOMP+(HCOMP-LCOMP). In other words, the timing computing unit 80 computes the third timing by adding the difference between the first timing and the second timing to the first timing.

The waveform of the digital signal in relation to FIG. 6A to FIG. 6D can easily be decided by a magnitude relation between HCOMP and LCOMP and a magnitude relation between the HIZ level and the first and second signal levels. It is preferable to select that the timing computing unit 80 computes the third timing using which method of the computing methods described in FIG. 6A to FIG. 6D based on a magnitude relation between HCOMP and LCOMP and a magnitude relation between the HIZ level and the first and second signal levels.

Figure 7:
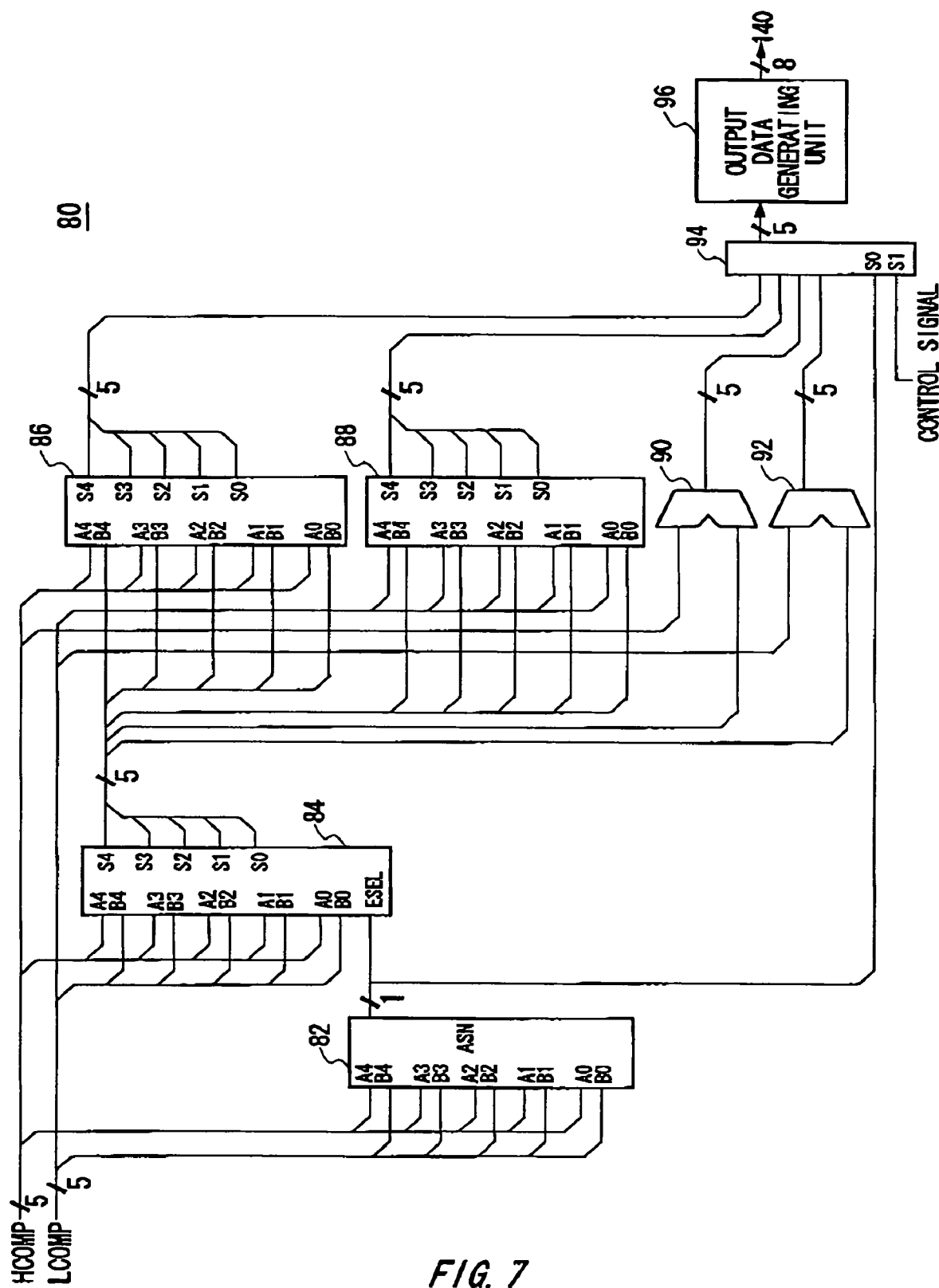
FIG. 7 is a view exemplary showing a configuration of the timing computing unit.

FIG. 7 is a view exemplary showing a configuration of the timing computing unit 80. In this example, the level comparing unit 20 is previously supplied with the first signal level and the second signal level in which the signal level difference between the third signal level and the first signal level is generally equal to the signal level difference between the first signal level and the second signal level.

The timing computing unit 80 has a small and large comparing unit 82, a first subtraction unit 84, a second subtraction unit 86, a third subtraction unit 88, a first addition unit 90, a second addition unit 92, a selecting unit 94, and an output data generating unit 96. The timing computing unit 80 receives HCOMP indicative of the first timing and LCOMP indicative of the second timing from the phase detecting unit 40.

The small and large comparing unit 82 decides a magnitude relation between HCOMP and LCOMP. The first subtraction unit 84 computes the difference between LCOMP and HCOMP. At this time, the first subtraction unit 84 selects which one of HCOMP and LCOMP is subtracted from the other according to a decision result by the small and large comparing unit 82.

The second subtraction unit 86 subtracts the value output from the first subtraction unit 84 from HCOMP to output its result. In other words, the second subtraction unit 86 outputs the value of HCOMP−(LCOMP−HCOMP) explained in FIG. 6A.

The third subtraction unit 88 subtracts the value output from the first subtraction unit 84 from LCOMP to output its result. In other words, the third subtraction unit 88 outputs the value of LCOMP−(HCOMP−LCOMP) explained in FIG. 6B.

The first addition unit 90 adds the value output from the first subtraction unit 84 to HCOMP to output its result. In other words, the first addition unit 90 outputs the value of HCOMP+(HCOMP−LCOMP) explained in FIG. 6D.

The second addition unit 92 adds the value output from the first subtraction unit 84 to LCOMP to output its result. In other words, the second addition unit 92 outputs the value of LCOMP+(LCOMP−HCOMP) explained in FIG. 6C.

The selecting unit 94 selects and outputs either of the values output from the second subtraction unit 86, the third subtraction unit 88, the first addition unit 90, and the second addition unit 92 based on a control signal and a decision result by the small and large comparing unit 82. Here, the control signal is a signal determined by a magnitude relation between the HIZ level and the first and second signal levels.

By such a configuration, although the digital signal is either of the waveforms explained in FIGS. 6A to 6D, it is possible to easily compute the timing at the variation point from the HIZ level or the variation point to the HIZ level.

Moreover, the output data generating unit 96 generates an output data to be transferred to the judgment unit 140 based on the data output from the selecting unit 94.

FIG. 8 is a view exemplary showing the output data generated from the output data generating unit 96. The output data generating unit 96 generates the output data including a bit indicative of the position of the variation point from the HIZ level of the data output from the selecting unit 94, a bit indicative of an initial value of H data, a bit indicative of a presence or absence of a glitch, and a bit indicative of a presence or absence of an error.

For example, when either of data output from the exclusive logic circuit 46 explained in FIGS. 4A and 4B or data output from the exclusive logic circuit 48 has a plurality of bits indicative of 1, the output data generating unit 96 decides that an edge of the digital signal has a glitch and generates the output data of which the bit indicative of a presence or absence of the glitch is 1. Moreover, when the data selected by the selecting unit 94 shows a negative value, the output data generating unit 96 generates the output data of which the bit indicative of a presence or absence of an error is 1 as an operation error.

By generating such an output data, it is possible to decide the good or bad of the electronic device 200 with high precision. For example, the judgment unit 140 may decide the good or bad of the electronic device 200 based on whether the timing at the variation point from the HIZ level is within a predetermined range and whether the edge of the digital signal has a glitch.

Figure 9:
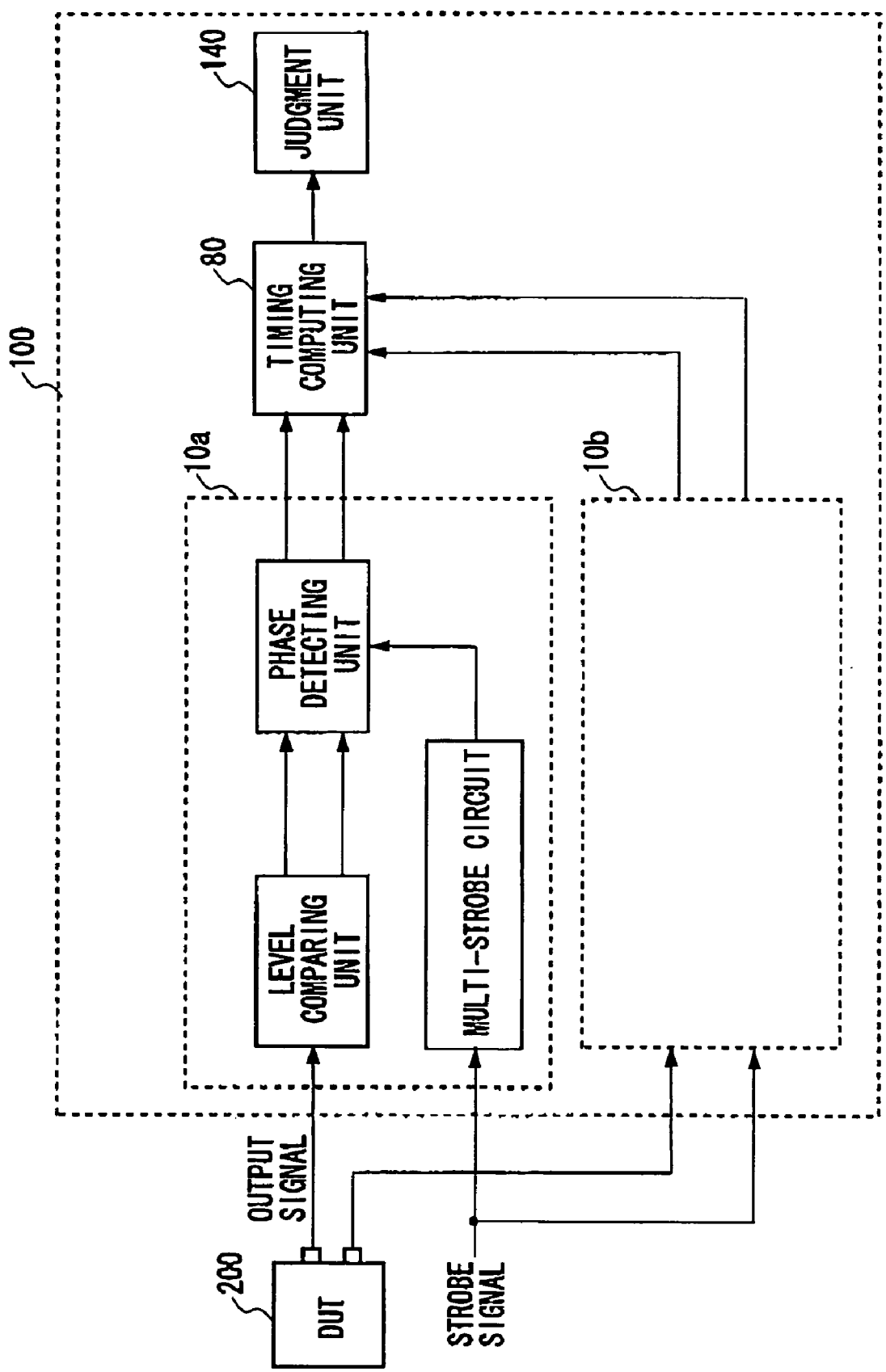
FIG. 9 is a view showing another example of a configuration of the measuring apparatus.

FIG. 9 shows another example of a configuration of the measuring apparatus 100. The measuring apparatus 100 in this example measures the timing at an intersection at which the differential digital signals output from the electronic device 200 intersects. Here, the intersection of the differential digital signals is a point at which both differential digital signals become the same signal level at the same timing.

The measuring apparatus 100 in this example includes a first reference timing detecting unit 10a, a second reference timing detecting unit 10b, a timing computing unit 80, and a judgment unit 140. The first reference timing detecting unit 10a and the second reference timing detecting unit 10b have the generally same function and configuration as the reference timing detecting unit 10 explained in reference to FIG. 1. Moreover, the components in FIG. 9 having the same reference numbers as those in FIG. 1 have the generally same function and configuration as the components described in reference to FIG. 1.

The first reference timing detecting unit 10a detects the first timing at which the first digital signal becomes the predetermined first signal level and the second timing at which the first digital signal becomes the second signal level different from the first signal level, in an edge of the first digital signal among the differential digital signals output from the electronic device 200. The method for detecting the first timing and the second timing is similar to the method for detecting the first timing and the second timing described in reference to FIG. 1.

The second reference timing detecting unit 10b detects the fourth timing at which the second digital signal becomes the predetermined fourth signal level and the fifth timing at which the second digital signal becomes the fifth signal level different from the fourth signal level, in an edge of the second digital signal among the differential digital signals output from the electronic device 200. The method for detecting the fourth timing and the fifth timing is similar to the method for detecting the first timing and the second timing described in reference to FIG. 1.

The timing computing unit 80 computes the timing at an intersection between the edge of the first digital signal and the edge of the second digital signal based on the first signal level, the second signal level, the fourth signal level, the fifth signal level, the first timing, the second timing, the fourth timing, and the fifth timing. For example, the timing computing unit 80 computes an equation of the edge of the first digital signal as described in FIG. 5 based on the first signal level, the second signal level, the first timing, and the second timing, and computes an equation of the edge of the second digital signal based on the fourth signal level, the fifth signal level, the fourth timing, and the fifth timing. Then, the timing computing unit 80 computes the timing at which the equation of the edge of the first digital signal and the equation of the edge of the second digital signal intersect each other.

Moreover, the judgment unit 140 decides the good or bad of the electronic device 200 based whether the timing at the intersection computed by the timing computing unit 80 is within a predetermined range.

Figure 10:
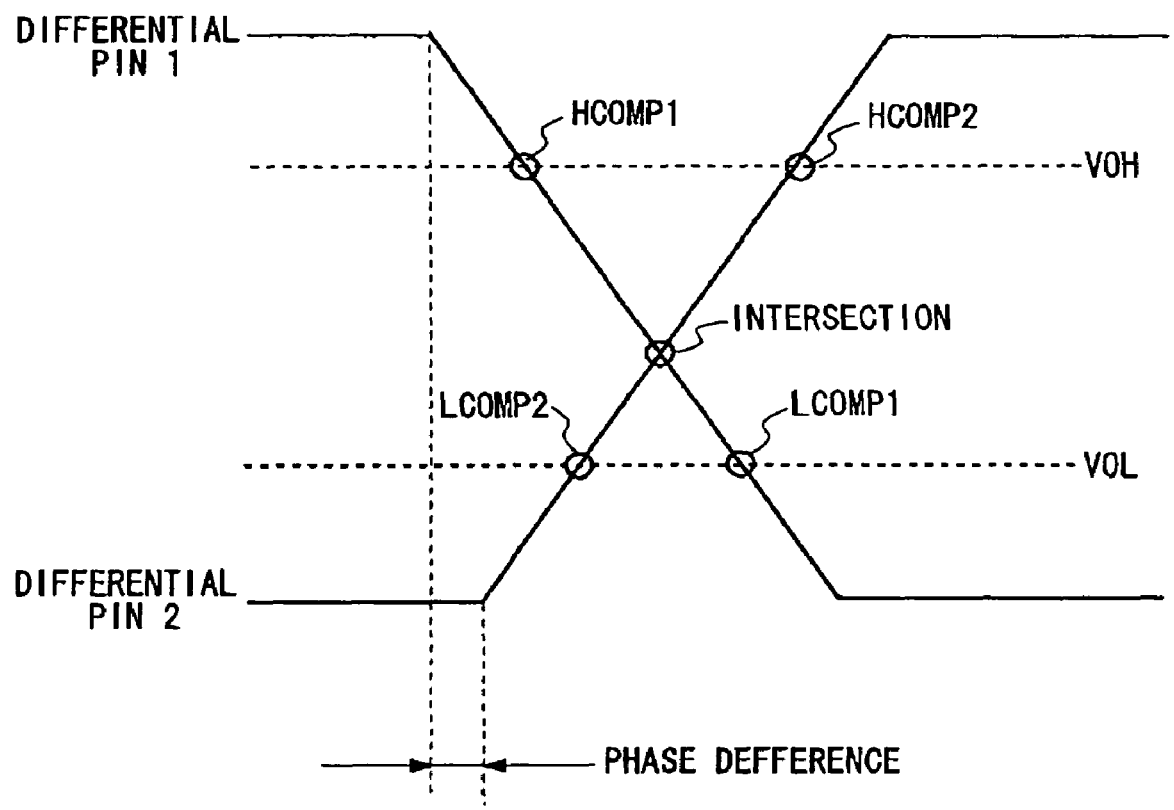
FIG. 10 is a view exemplary showing a waveform of a differential digital signal.

FIG. 10 is a view exemplary showing a waveform of a differential digital signal. As described above, the first reference timing detecting unit 10a detects the first timing (HCOMP1) at which the first digital signal becomes the first signal level (VOH) and the second timing (LCOMP1) at which the first digital signal becomes the second signal level (VOL), in the edge of the first digital signal output from a differential pin 1 of the electronic device. Moreover, the second reference timing detecting unit 10b detects the fourth timing (HCOMP2) at which the second digital signal becomes the fourth signal level (VOH) and the fifth timing (LCOMP2) at which the second digital signal becomes the fifth signal level (VOL), in the edge of the second digital signal output from a differential pin 2 of the electronic device. In this example, the first signal level and the fourth signal level are equal to each other, and the second signal level and the fifth signal level are equal to each other.

The timing computing unit 80 computes a slope of the edge of the first digital signal based on the first timing and the second timing detected from the first reference timing detecting unit 10a. Moreover, the timing computing unit 80 computes a slope of the edge of the second digital signal based on the fourth timing and the fifth reference timing detected from the second reference timing detecting unit 10b. Then, the timing computing unit 80 computes the timing at the intersection between the differential digital signals based on the slope of the edge of the first digital signal and the slope of the edge of the second digital signal.

Figure 11:
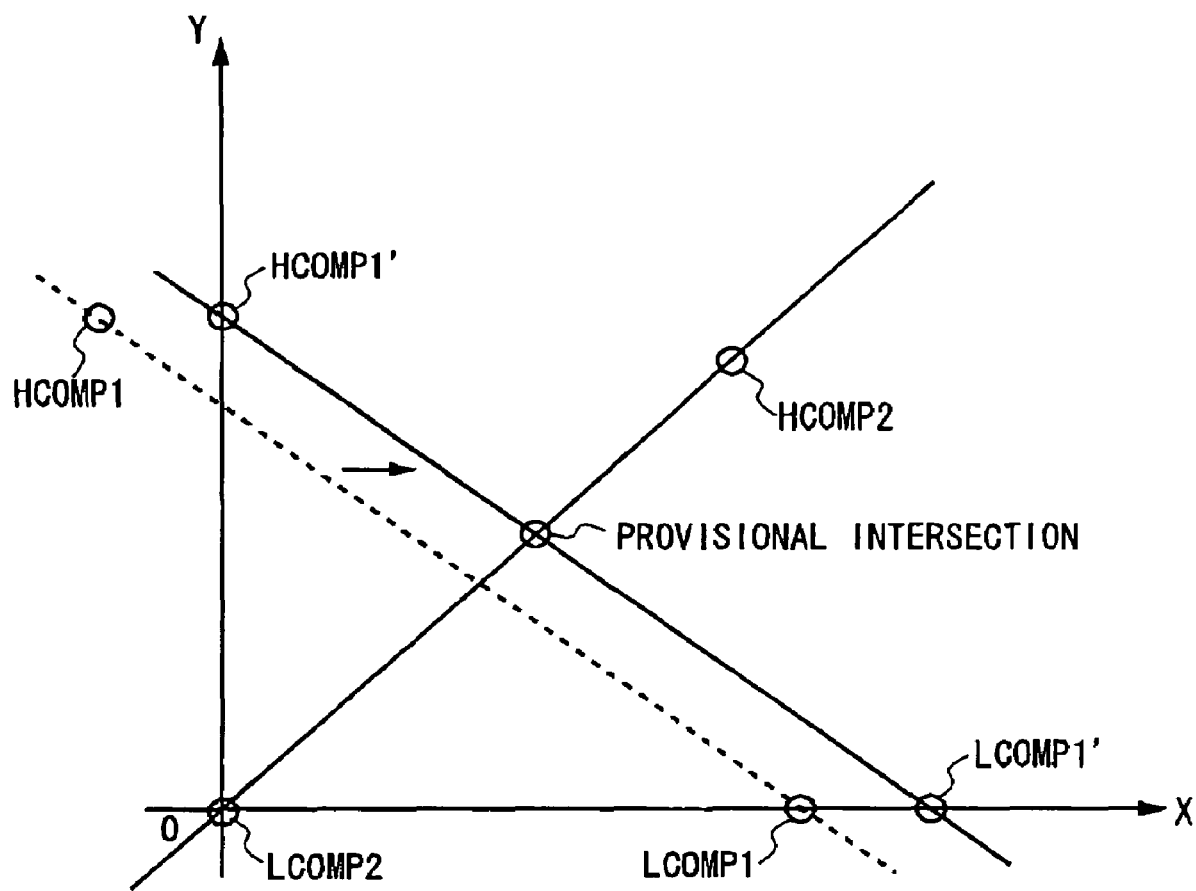
FIG. 11 is a view exemplary explaining a computation method of the timing at an intersection in the timing computing unit.

FIG. 11 is a view exemplary explaining a computation method of the timing at the intersection in the timing computing unit 80. In FIG. 11, a horizontal axis shows the timing and a vertical axis shows a signal level.

At first, the timing of LCOMP of a rising edge uses as an origin among the edge of the first digital signal and the edge of the second digital signal. In this example, LCOMP2 is explained as an origin.

Then, a straight line linking two points of HCOMP1' and LCOMP1' is obtained by moving in parallel a straight line of the edge of the first digital signal so that the first timing (HCOMP1) and the fourth timing (LCOMP2) are identical with each other. Then, an intersection between the straight lines moved in parallel and the straight line linking two points of LCOMP2 and HCOMP2 is computed as a provisional intersection. The timing computing unit 80 computes the timing at the provisional intersection based on the slope of the edge of the first digital signal and the slope of the edge of the second digital signal.

Moreover, the timing computing unit 80 computes the difference between the timing at the original intersection and the timing at the provisional intersection from the slope of each edge and a parallel distance of the straight line. Then, the difference of the timing is added to the computed provisional intersection. Moreover, since the second digital signal is moved in parallel so that LCOMP2 firstly becomes an origin, the timing at the intersection between the differential digital signals is computed by further adding an amount of the phase shift to the timing at the provisional intersection.

Figure 12:
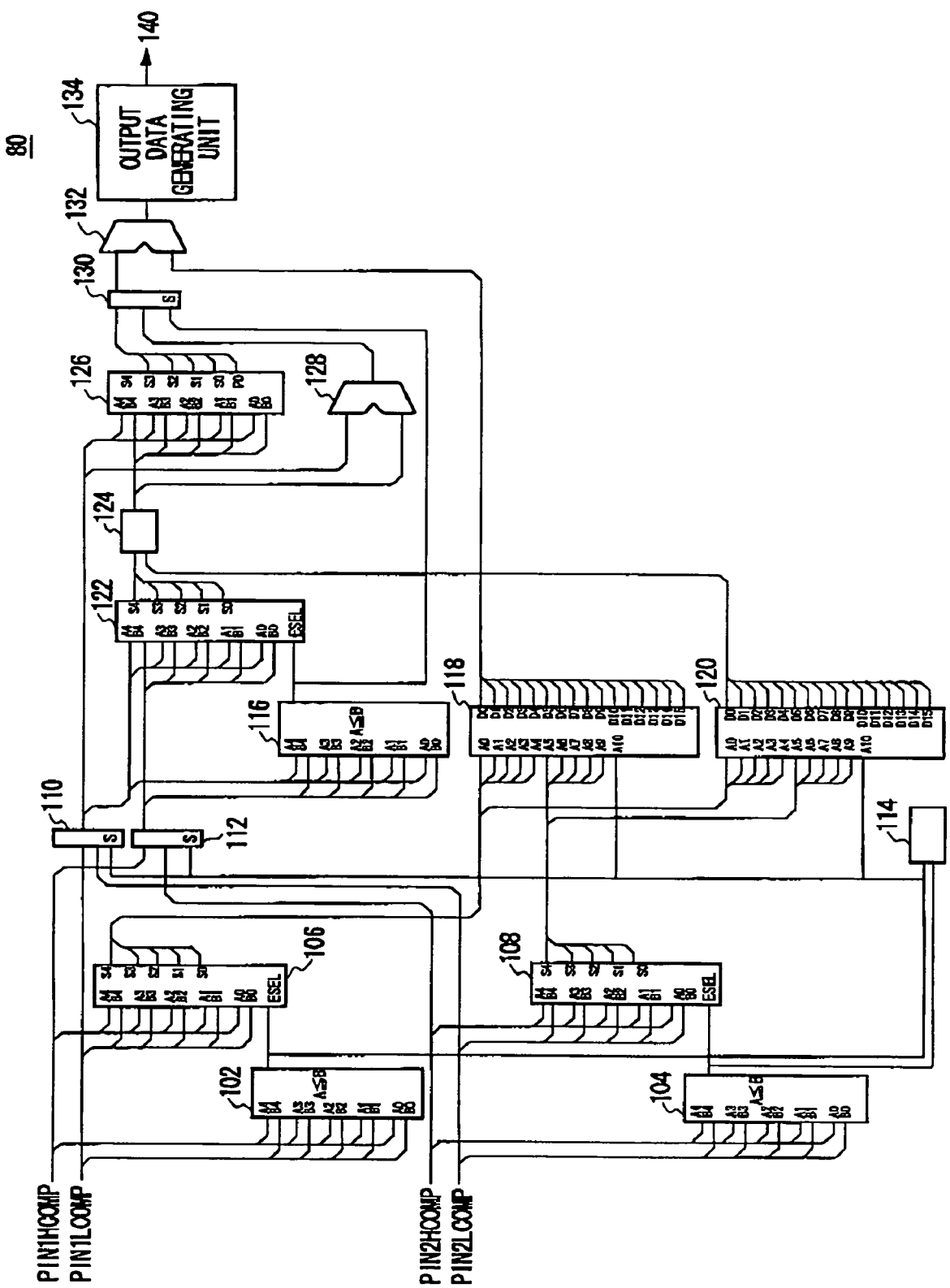
FIG. 12 is a view exemplary showing a configuration of the timing computing unit.

FIG. 12 is a view exemplary showing a configuration of the timing computing unit 80. The timing computing unit 80 has comparing units (102, 104, 116), subtraction units (106, 108, 122, 126), addition units (128, 132), a timing storing unit 118, a phase shift correction coefficient storing unit 120, a multiplication unit 124, selecting units (110, 112, 130), an error detecting unit 114, and an output data generating unit 134.

The comparing unit 102 receives the first timing (HCOMP1) and the second timing (LCOMP1) at the edge of the first digital signal, and decides a magnitude relation between the first timing and the second timing, in order to decide whether that edge of the first digital signal is a rising edge or a trailing edge.

The comparing unit 104 receives the fourth timing (HCOMP2) and the fifth timing (LCOMP2) at the edge of the second digital signal, and decides a magnitude relation between the fourth timing and the fifth timing, in order to decide whether that edge of the second digital signal is a rising edge or a trailing edge.

The subtraction unit 106 computes the timing difference between the first timing (HCOMP1) and the second timing (LCOMP1). At this time, the subtraction unit 106 determines that anyone of the first timing and the second timing is subtracted from the other according to a decision result by the comparing unit 102. Since the values of VOH and VOL are known, the slope of the edge of the first digital signal is defined by the timing difference between the first timing and the second timing. In other words, the subtraction unit 106 functions as a first slope computing unit that outputs that timing difference as a value indicative of the slope of the edge of the first digital signal.

The subtraction unit 108 computes the timing difference between the fourth timing (HCOMP2) and the fifth timing (LCOMP2). At this time, the subtraction unit 108 determines that any one of the fourth timing and the fifth timing is subtracted from the other according to a decision result by the comparing unit 104. Similarly, the subtraction unit 108 also functions as a second slope computing unit that outputs that timing difference as a value indicative of the slope of the edge of the second digital signal.

The timing storing unit 118 stores the provisional timing at the intersection between the differential digital signals with respect to a combination of each of the slope of the edge of the first digital signal and the slope of the edge of the second digital signal, and outputs the provisional timing according to the slope of the edge of the first digital signal and the slope of the edge of the second digital signal to be supplied.

The phase shift correction coefficient storing unit 120 stores a correction coefficient to correct the provisional timing output from the timing storing unit 118 as described in FIG. 11. In this example, the phase shift correction coefficient storing unit 120 stores an unit correction coefficient per a unit phase difference between a phase of the first digital signal and a phase of the second digital signal with respect to a combination of each of the slope of the edge of the first digital signal and the slope of the edge of the second digital signal, and outputs the unit correction coefficient according to the slope of the edge of the first digital signal and the slope of the edge of the second digital signal to be supplied.

The selecting unit 110 selects a reference phase to compute a phase difference between a phase of the first digital signal and a phase of the second digital signal from either of LCOMP1 (the second timing) or LCOMP2 (the fifth timing). In this example, the selecting unit 110 decides which edge of the edge of the first digital signal and the edge of the second digital signal is a rising edge and selects LCOMP at the rising edge, based on a decision result by the comparing unit 102.

The selecting unit 112 selects a reference phase to compute a phase difference between a phase of the first digital signal and a phase of the second digital signal from either of HCOMP1 (the first timing) or HCOMP2 (the fourth timing). In this example, the selecting unit 112 decides which edge of the edge of the first digital signal and the edge of the second digital signal is a trailing edge and selects HCOMP at the trailing edge, based on a decision result by the comparing unit 102.

The comparing unit 116 decides a magnitude relation between the reference phase selected by the selecting unit 110 and the reference phase selected by the selecting unit 112. Moreover, the subtraction unit 122 computes the difference between the reference phase selected by the selecting unit 110 and the reference phase selected by the selecting unit 112. At this time, the subtraction unit 122 determines which reference phase is subtracted from the other according to the decision result by the comparing unit 116. The subtraction unit 122 functions as a phase difference computing unit that computes a phase difference between a phase of the first digital signal and a phase of the second digital signal.

The multiplication unit 124 computes a correction coefficient obtained by multiplying the phase difference computed by the subtraction unit 122 by the unit correction coefficient output from the phase shift correction coefficient storing unit 120. Then, the addition unit 128 outputs a value obtained by adding the correction coefficient output from the multiplication unit 124 to the reference phase selected by the selecting unit 110. Moreover, the subtraction unit 126 outputs a value obtained by subtracting the correction coefficient computed from the multiplication unit 124 from the reference phase selected by the selecting unit 110.

The selecting unit 130 selects and outputs either of the value output from the subtraction unit 126 or the value output from the addition unit 128 based on the decision result by the comparing unit 116. In other words, the selecting unit 130 decides a shift direction of the edge of the first digital signal in relation to a positive or negative direction in an example of FIG. 11 and selects whether the correction coefficient computed by the multiplication unit 124 is added or subtracted according to the decision result, based on the magnitude relation between the reference phase selected by the selecting unit 110 and the reference phase selected by the selecting unit 112.

The addition unit 132 computes the timing at the intersection of the differential digital signals by adding the value selected by the selecting unit 130 to the provisional timing output from the timing storing unit 118. Moreover, the output data generating unit 134 generates output data to be transferred to the judgment unit 140 based on the timing at the intersection of the differential digital signals computed from the addition unit 132. The output data generating unit 134 may have the same function as the output data generating unit 96 explained in FIG. 7.

Moreover, the error detection unit 114 receives the decision results from the comparing unit 102 and the comparing unit 104, and measures a measurement error when both of the edge of the first digital signal and the edge of the second digital signal are rising edges or trailing edges in order to inform the outside of the error.

According to the timing computing unit 80 in this example, it is possible to easily compute the timing at the intersection of the differential digital signals.

Figure 13:
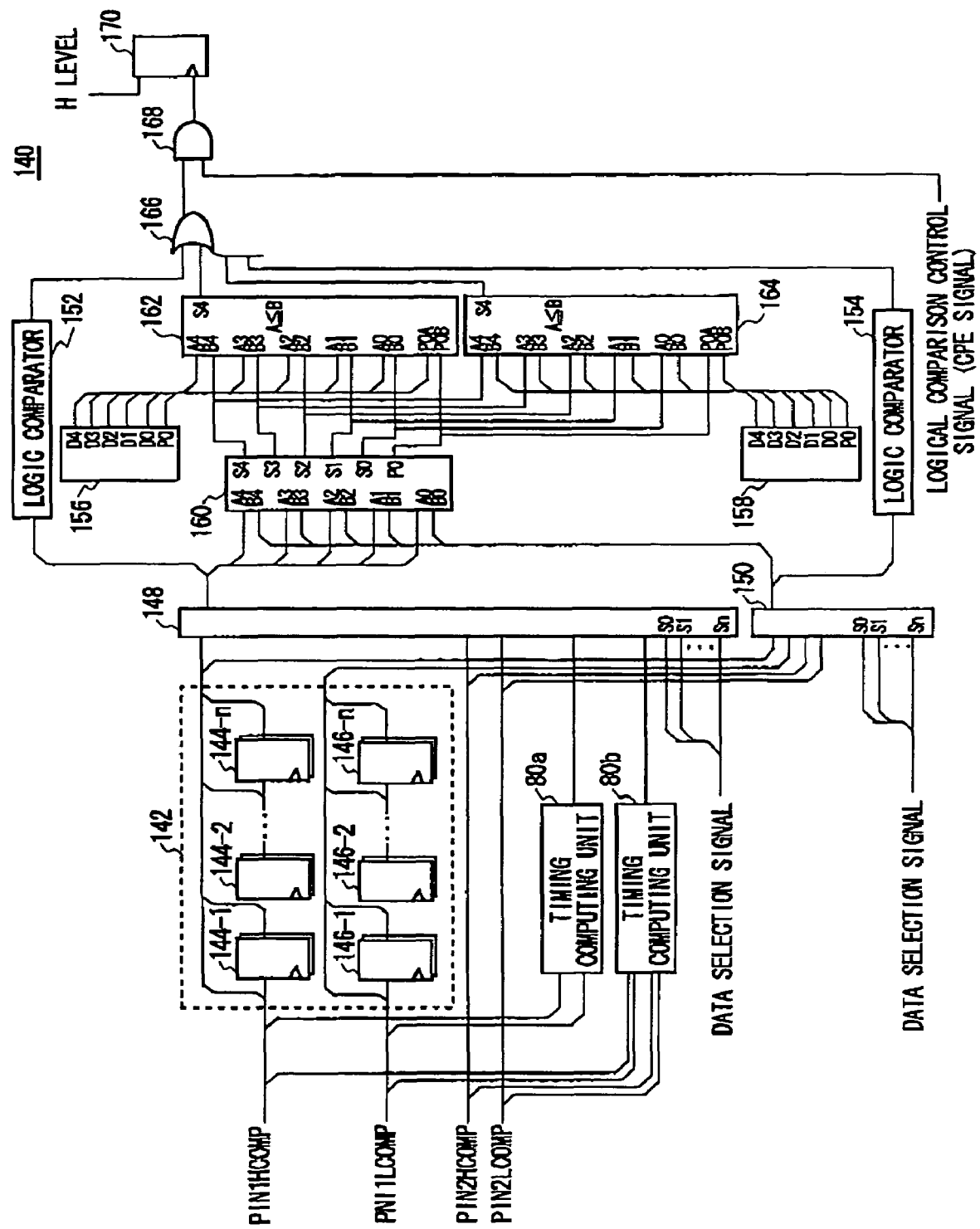
FIG. 13 is a view exemplary showing a configuration of a judgment unit.

FIG. 13 is a view exemplary showing a configuration of the judgment unit 140. Moreover, in this example, the measuring apparatus 100 includes a timing computing unit 80a that computes the timing at the variation point from the HIZ level and a timing computing unit 80b that computes the timing at the intersection of the differential digital signals, and measures the timing at the variation point from the HIZ level of the first digital signal and the timing at the intersection of the differential digital signals at the same time. Moreover, in this example, a glitch detecting bit, an initial value bit, etc. are included in HCOMP data and LCOMP data.

The timing computing unit 80a has the same function and configuration as those of the timing computing unit 80 explained in reference to FIG. 7 and the timing computing unit 80b has the same function and configuration as those of the timing computing unit 80b explained in reference to FIG. 12.

The judgment unit 140 has a shift unit 142, a selecting unit 148, a selecting unit 150, a logic comparator 152, a logic comparator 154, a subtraction unit 160, a memory 156, a memory 158, a comparing unit 162, a comparing unit 164, an OR circuit 166, an AND circuit 168, and a latch circuit 170.

The shift unit 142 shifts data of HCOMP1 and LCOMP1 in cycle units so that the data of HCOMP1 and LCOMP1 can logically be compared with data of HCOMP2 and LCOMP2. The shift unit 142 has a plurality of latch circuits 144 for cycle shift and a latch circuit 146.

Moreover, the selecting unit 148 selects and outputs either of HCOMP1, LCOMP1, HCOMP2, LCOMP2, data output from the timing computing unit 80a, or data output from the timing computing unit 80b. Moreover, the selecting unit 150 selects and outputs either of HCOMP1, LCOMP1, HCOMP2, or LCOMP2. The selecting unit 148 and the selecting unit 150 are respectively supplied with a data select signal indicative of which data should be selected according to test contents. Moreover, the selecting unit 148 and the selecting unit 150 may output data having a value of zero.

For example, when testing the timing at the variation point from the HIZ level of the electronic device 200, the selecting unit 148 selects the data output from the timing computing unit 80a and the selecting unit 150 outputs the data having a value of zero.

The subtraction unit 160 computes a value obtained by subtracting the data selected by the selecting unit 150 from the data selected by the selecting unit 148. Here, a P0 terminal of the subtraction unit 160 is a sign terminal.

On the memory 156, a lower limit of the data to be output from the subtraction unit 160 is previously stored according to test contents. Moreover, on the memory 156, an upper limit of the data to be output from the subtraction unit 160 is previously stored according to test contents.

The comparing unit 162 decides whether the data output from the subtraction unit 160 is greater or equal to the lower limit stored on the memory 156. For example, when the data output from the subtraction unit 160 is smaller than the lower limit, the comparing unit 162 outputs 1 as a fail.

The comparing unit 164 decides whether the data output from the subtraction unit 160 is less or equal to the upper limit stored on the memory 156. For example, when the data output from the subtraction unit 160 is larger than the upper limit, the comparing unit 164 outputs 1 as a fail.

Moreover, when data indicative of the presence of glitch seems to be included in the data selected by the selecting unit 148, the logic comparator 152 outputs 1 as a fail. Similarly, when data indicative of the presence of glitch seems to be included in the data selected by the selecting unit 150, the logic comparator 153 also outputs 1 as a fail.

When at least one of the logic comparator 152, the logic comparator 154, the comparing unit 162, and the comparing unit 164 outputs 1 as a fail, the OR circuit 166 outputs 1 as a fail. Moreover, the AND circuit 168 is supplied with a logical comparison control signal for controlling whether the good or bad of the electronic device 200 should be decided, and the output from the OR circuit 166 is output to the latch circuit 170 when the logical comparison control signal is 1. By such an operation, it is possible to easily decide the good or bad of the electronic device 200.

Figure 14:
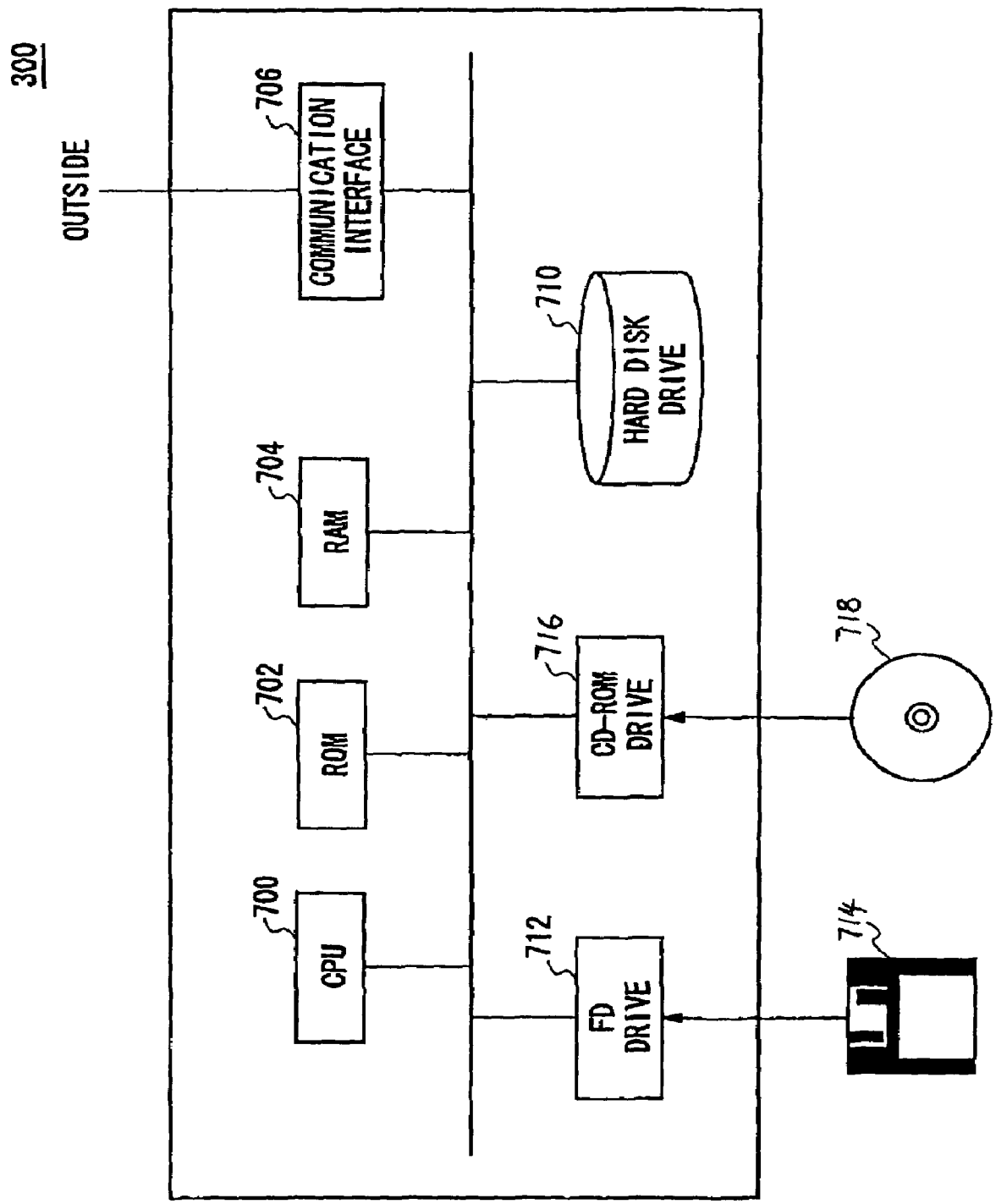
FIG. 14 is a view exemplary showing a configuration of a computer that controls the measuring apparatus.

FIG. 14 is a view exemplary showing a configuration of a computer 300 that controls the measuring apparatus 100. In this example, the computer 300 stores a program causing the measuring apparatus 100 to function as the measuring apparatus 100 explained in FIGS. 1 to 13. Moreover, the computer 300 may function as the measuring apparatus 100.

The computer 300 includes a CPU 700, a ROM 702, a RAM 704, a communication interface 706, a hard disk drive 710, a FD disk drive 712, and a CD-ROM drive 716. The CPU 700 operates based on a program stored on the ROM 702, the RAM 704, the hard disk 710, the FD disk 714, and/or the CD-ROM 718.

For example, when causing the computer 300 to function as the measuring apparatus 100, the program causes the computer 300 to function as the reference timing detecting unit 10, the timing computing unit 80, and the judgment unit 140 explained in reference to FIG. 1 or 9.

Moreover, when causing the measuring apparatus 100 to function, the communication interface 706 transmits a control signal for making the measuring apparatus 100 function as the reference timing detecting unit 10, the timing computing unit 80, and the judgment unit 140 explained in reference to FIG. 1 or 9, according to the program. The hard disk drive 710, the ROM 702, or the RAM 704 as an example of a storage device stores a program, etc. to operate setting information and the CPU 700. Moreover, the program may be stored on a recording medium such as the flexible disk 714 and the CD-ROM 718.

The flexible drive 712 reads a program from the flexible disk 714 to provide it to the CPU 700 when the flexible disk 714 stores the program. The CD-ROM drive 716 reads a program from the CD-ROM 718 to provide it to the CPU 700 when the CD-ROM stores the program.

Moreover, although a program is directly read from a recording medium to the RAM to be executed, the program may be read to the RAM in order to be executed after being installed in the hard disk drive. Further, the program may be stored on a single recording medium or a plurality of recording media. Moreover, a program stored on the recording medium may provide each function jointly with an operating system. For example, the program may request the operating system to execute a part or all of functions and provide the functions based on a response from the operating system.

A recording medium storing a program can use an optical recording medium such as DVD, PD, etc., a magneto-optical recording medium such as MD, etc., a tape medium, a magnetic recording media, a semiconductor memory such as an IC card, a miniature card, etc, besides the flexible disk and the CD-ROM. Moreover, a storage device such as the hard disk, the RAM, etc., provided in a server system connected to a private communication network or an Internet may be used as a recording medium.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

The timing measured by the measuring apparatus 100 is not limited to the timing at the variation point from the HIZ level or the timing at the intersection of the differential digital signals. For example, the timing at a variation point from an L level at a rising edge of a digital signal can easily be measured.

As apparent from the above descriptions, according to the present invention, it is possible to easily compute the timing at the variation point at which the output signal output from the electronic device varies from the HIZ level. Moreover, it is possible to easily compute the timing at the intersection of the differential digital signals output from the electronic device.

What is claimed is:

1. A measuring apparatus that measures differential digital signals, comprising:
a first reference timing detecting unit operable to detect a first timing at which a first digital signal becomes a first predetermined signal level and a second timing at which the first digital signal becomes a second signal level different from the first signal level, in an edge of the first digital signal among the differential digital signals;
a second reference timing detecting unit operable to detect a fourth timing at which a second digital signal becomes a fourth predetermined signal level and a fifth timing at which the second digital signal becomes a fifth signal level different from the fourth signal level, in an edge of the second digital signal among the differential digital signals; and
a timing computing unit operable to compute a timing at an intersection of the edge of the first digital signal and the edge of the second digital signal based on the first signal level, the second signal level, the fourth signal level, the fifth signal level, the first timing, the second timing, the fourth timing, and the fifth timing,
wherein said timing computing unit comprises:
a first slope computing unit that computes a slope of the edge of the first digital signal based on the first timing and the second timing detected by said first reference timing detecting unit;
a second slope computing unit that computes a slope of the edge of the second digital signal based on the fourth timing and the fifth timing detected by said second reference timing detecting unit, wherein the timing at the intersection is computed based on the slope of the edge of the first digital signal and the slope of the edge of the second digital signal;
a timing storing unit that stores a provisional timing at the intersection with respect to a combination of the slope of the edge of the first digital signal and the slope of the edge of the second digital signal and outputs the provisional timing according to the slope of the edge of the first digital signal and the slope of the edge of the second digital signal to be supplied;
a phase shift correction coefficient storing unit that stores a unit correction coefficient, to correct the provisional timing, per a unit phase difference between a phase of the first digital signal and a phase of the second digital signal with respect to the combination of the slope of the edge of the first digital signal and the slope of the edge of the second digital signal and outputs the unit correction coefficient according to the slope of the edge of the first digital signal and the slope of the edge of the second digital signal to be supplied; and
a multiplication unit that computes a phase difference between the phase of the first digital signal and the phase of the second digital signal and computes a correction coefficient made by multiplying the phase difference by the unit correction coefficient output from said phase shift correction coefficient storing unit, and the timing at the intersection is computed based on the provisional timing output from said timing storing unit and the correction coefficient output from said multiplication unit.

2. A computer readable medium containing instructions for making a measuring apparatus measure differential digital signals, comprising:
a first reference timing detecting unit operable to detect a first timing at which a first digital signal becomes a first predetermined signal level and a second timing at which the first digital signal becomes a second signal level different from the first signal level, in an edge of the first digital signal among the differential digital signals;

a second reference timing detecting unit operable to detect a fourth timing at which a second digital signal becomes a fourth predetermined signal level and a fifth timing at which the second digital signal becomes a fifth signal level different from the fourth signal level, in an edge of the second digital signal among the differential digital signals; and a timing computing unit operable to compute a timing at an intersection of the edge of the first digital signal and the edge of the second digital signal based on the first signal level, the second signal level, the fourth signal level, the fifth signal level, the first timing, the second timing, the fourth timing, and the fifth timings, wherein said timing computing unit comprises:

a first slope computing unit that computes a slope of the edge of the first digital signal based on the first timing and the second timing detected by said first reference timing detecting unit;

a second slope computing unit that computes a slope of the edge of the second digital signal based on the fourth timing and the fifth timing detected by said second reference timing detecting unit, wherein the timing at the intersection is computed based on the slope of the edge of the first digital signal and the slope of the edge of the second digital signal;

a timing storing unit that stores a provisional timing at the intersection with respect to a combination of the slope of the edge of the first digital signal and the slope of the edge of the second digital signal and outputs the provisional timing according to the slope of the edge of the first digital signal and the slope of the edge of the second digital signal to be supplied;

a phase shift correction coefficient storing unit that stores a unit correction coefficient, to correct the provisional timing, per a unit phase difference between a phase of the first digital signal and a phase of the second digital signal with respect to the combination of the slope of the edge of the first digital signal and the slope of the edge of the second digital signal and outputs the unit correction coefficient according to the slope of the edge of the first digital signal and the slope of the edge of the second digital signal to be supplied; and a multiplication unit that computes a phase difference between the phase of the first digital signal and the phase of the second digital signal and computes a correction coefficient made by multiplying the phase difference by the unit correction coefficient output from said phase shift correction coefficient storing unit, and the timing at the intersection is computed based on the provisional timing output from said timing storing unit and the correction coefficient output from said multiplication unit.

* * * * *